United States Patent
Kang et al.

(10) Patent No.: US 8,384,078 B2
(45) Date of Patent: Feb. 26, 2013

(54) ORGANIC LIGHT EMITTING DISPLAY DEVICE AND METHOD OF MANUFACTURING THE SAME

(75) Inventors: Ki-Nyeng Kang, Yongin (KR); Young-Shin Pyo, Yongin (KR); Jae-Seob Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 211 days.

(21) Appl. No.: 12/831,533

(22) Filed: Jul. 7, 2010

(65) Prior Publication Data

US 2011/0127519 A1 Jun. 2, 2011

(30) Foreign Application Priority Data

Nov. 27, 2009 (KR) .................. 10-2009-0115722

(51) Int. Cl.
*H01L 29/10* (2006.01)
(52) U.S. Cl. ..... 257/43; 257/59; 257/347; 257/E29.276; 257/E33.002; 257/E21.461; 438/34; 438/104
(58) Field of Classification Search ............ 257/43, 257/59, 347, E29.276, E33.002, E21.461; 438/34, 104
See application file for complete search history.

(56) References Cited

U.S. PATENT DOCUMENTS

| 2002/0000552 A1* | 1/2002 | Morimoto et al. ............. 257/59 |
| 2008/0128689 A1* | 6/2008 | Lee et al. ....................... 257/43 |
| 2008/0308797 A1* | 12/2008 | Akimoto et al. ............... 257/43 |
| 2010/0026169 A1* | 2/2010 | Jeong et al. .................. 313/504 |
| 2010/0084648 A1* | 4/2010 | Watanabe ...................... 257/43 |

FOREIGN PATENT DOCUMENTS

| JP | 2009-099953 | 5/2009 |
| KR | 10-2000-0070100 | 11/2000 |
| KR | 10-2008-0061067 | 7/2008 |
| KR | 10-2009-0040658 | 4/2009 |
| KR | 10-2009-0047721 | 5/2009 |
| WO | 2008/126884 | 10/2008 |

* cited by examiner

*Primary Examiner* — Tu-Tu Ho
(74) *Attorney, Agent, or Firm* — H.C. Park & Associates, PLC

(57) ABSTRACT

An organic light emitting display device and a method for manufacturing the same. The organic light emitting display device includes: an insulating layer formed on a substrate; a resistance layer of oxide semiconductor formed on the insulating layer; a wiring layer connected to both side portions of the resistance layer; an organic layer formed on the upper portion including the resistance layer and the wiring layer; and a capping layer formed on the organic layer to be overlapped with the resistance layer.

7 Claims, 3 Drawing Sheets

ORGANIC LIGHT EMITTING DISPLAY DEVICE AND METHOD OF MANUFACTURING THE SAME

CROSS-REFERENCE TO RELATED APPLICATION

This application claims priority to and the benefit of Korean Patent Application No. 10-2009-0115722, filed on Nov. 27, 2009, in the Korean Intellectual Property Office, the entire content of which is incorporated herein by reference.

BACKGROUND

1. Field of the Invention

An embodiment of the present invention relates to an organic light emitting display device and a method of manufacturing the same, and more specifically, to an organic light emitting display device including a resistive element of oxide semiconductor and a method of manufacturing the same.

2. Description of the Related Art

An organic light emitting display device, which is a next-generation display device with self-emitting characteristics, has excellent characteristics with regards to viewing angle, contrast, response speed, power consumption, etc., and can be light in weight and slim in design since it does not require a backlight.

The organic light emitting display device includes a substrate that has a pixel area and a non-pixel area and a container or a sealing substrate that is disposed to face the substrate to encapsulate the substrate and is bonded to the substrate by a sealant.

A plurality of organic light emitting display devices that are connected between scan lines and data lines in a matrix manner and forms pixels are formed in the pixel region on the substrate. On the other hand, scan and data lines that extend from a scan line and a data line in a pixel region, a power supply line that operates the organic light emitting display device, and a scan drive IC and a data drive IC that process a signal supplied through an input pad from the outside of the light emitting display and supply the signal to the scan and data lines are formed in a non-pixel region.

An input pad of the organic light emitting display device configured as described above is electrically connected to a flexible printed circuit (FPC) (not shown) and receives an electrical signal through the flexible circuit substrate from outside of the organic light emitting display device.

When a signal is input to the power supply line, the scan driver, and the data driver, the scan driver and the data driver supply a scan signal and a data signal to the scan line and the data line, respectively. Therefore, the organic light emitting device of the pixel selected by the scan signal emits light corresponding to the data signal.

However, the organic light emitting display device generates a large amount of electrostatic discharge (ESD) during the manufacturing or use thereof since the substrate is made of glass, etc. When the electrostatic discharge is introduced into the organic light emitting device or the driving circuit that quickly operates at low voltage, the organic light emitting device or the driving circuit may malfunction or may be damaged by an electrical effect. When the electrostatic discharge generated from the outside is introduced into the driving circuit through the internal wiring, the operation of the driving circuit may momentarily stop and when the generation frequency or voltage of the electrostatic discharge is increased, the circuit line may be disconnected or short. The damage due to the electrostatic discharge is more serious as the driving circuit is gradually high-integrated (miniaturization).

In order to prevent damage due to the electrostatic discharge, the introduction of the electrostatic discharge is interrupted by using a resistive element or a diode, etc. In the case of the display device including a general polysilicon thin film transistor, ions are doped on the polysilicon to form the resistive element. However, with the development of the thin film transistor using as an active layer the oxide semiconductor which has excellent electrical characteristic and processing speeds as compared to the polysilicon, it is difficult to form the resistive element as the oxide semiconductor with a high resistance value (Mega ohm/square).

Since the process of manufacturing the thin film transistor using the oxide semiconductor as the active layer does not include the doping process, the resistive element should be formed by using a metal as a gate electrode or source and drain electrodes when the display device includes the oxide semiconductor thin film transistor. Therefore, the resistive element should be formed in a serpentine type over a wide area in order to implement the desired resistance value, such that there is a limitation in the miniaturization of the display device.

SUMMARY

An embodiment of the present invention provides an organic light emitting display device including a resistive element of oxide semiconductor and a method of manufacturing the same.

According to another aspect of the present invention, there is provided an organic light emitting display device including: a substrate; an insulating layer that is formed on the substrate; a resistance layer of oxide semiconductor that is formed on the insulating layer; a wiring layer that is connected to both side portions of the resistance layer; an organic layer that is formed on the upper portion including the resistance layer and the wiring layer; and a capping layer that is formed on the organic layer to be overlapped with the resistance layer.

According to another aspect of the present invention, there is provided a method of manufacturing an organic light emitting display device including: forming a first insulating layer on a substrate; forming a resistance layer of oxide semiconductor on the first insulating layer; forming a second insulating layer on an upper portion including the resistance layer; forming a contact hole on the second insulating layer to expose both side portions of the resistance layer; forming a wiring layer to be connected to both side portions of the resistance layer through the contact hole; forming an organic layer on the upper portion including the wiring layer and the resistance layer; forming a capping layer on the organic layer to be overlapped with the resistance layer; performing cleaning with hydrogen (H) containing cleaning solution; and performing heat treatment in order to diffuse hydrogen (H) absorbed in the organic layer when cleaning the resistance layer.

According to another aspect of the present invention, the organic light emitting display device includes the resistive element to prevent damage to the organic light emitting display device due to electrostatic discharge, by forming the resistive element using the oxide semiconductor. The oxide semiconductor in an amorphous type with N-type semiconductor characteristics is advantageous in the electrical characteristic and the process as compared to the polysilicon, but is difficult to use as the resistive element of the display device due to the high resistance value However, according to an embodiment of the present invention hydrogen (H) infiltrates into the organic layer and diffuses hydrogen (H) to the resistance layer of the oxide semiconductor by the capping layer, thereby making it possible to implement the resistance value that can be applied to the display device. According to an embodiment of the present invention, the process of forming the oxide semiconductor thin film transistor and the organic light emitting device does not require adding or changing the manufacturing processes, such that the manufacturing cost is not increased and the desired resistance value can be easily implemented at a smaller area than forming the resistive element by using the metal used as the gate electrode or the source and drain electrodes.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
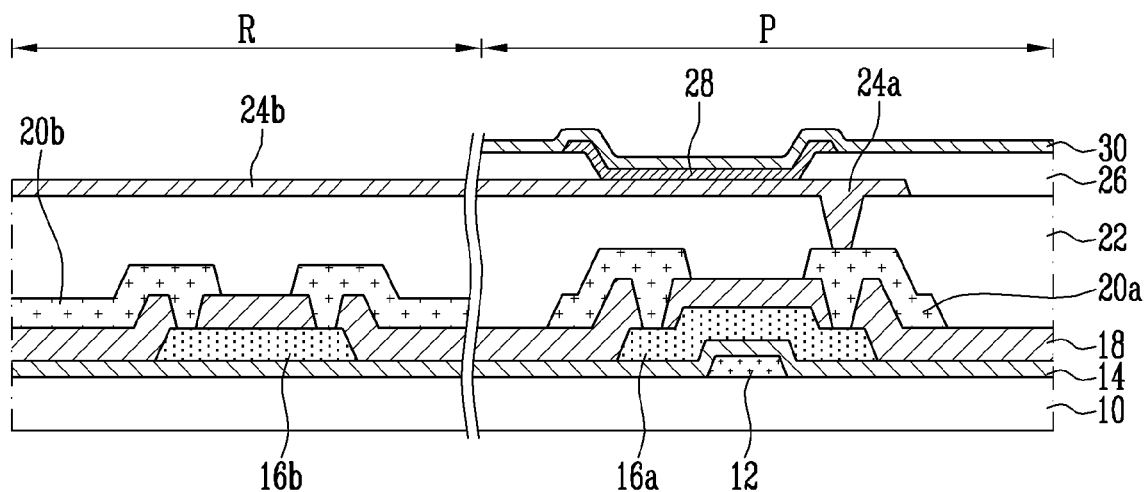
FIG. 1 is a cross-sectional view of an organic light emitting display device according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween. Hereinafter, like reference numerals refer to like elements.

Certain exemplary embodiments of the present invention will be described in detail with reference to the accompanying drawings. The following embodiments are provided so that those skilled in the art to which the present invention pertains can fully understand the embodiments of the present invention and can be changed to various forms and therefore, are not limited to the following embodiments.

FIG. 1 is a cross-sectional view illustrating an organic light emitting display device according to an embodiment of the present invention. FIG. 1 schematically shows a pixel area P in which a thin film transistor and an organic light emitting device are formed and a non-pixel area R in which a resistive element is formed to prevent electrostatic discharge.

A gate electrode 12 of the thin film transistor is formed on a substrate 10 in the pixel area P and a gate insulating layer 14 is formed on the substrate 10 in the pixel area P including the gate electrode 12 and on the substrate 10 of the non-pixel area R.

An active layer 16a is formed on the gate insulating layer 14 in the pixel area P that includes the gate electrode 12 and a resistance layer 16b is formed on the gate insulating layer 14 in the non-pixel area R. The active layer 16a that provides a channel region, a source region, and a drain region of the thin film transistor and the resistance layer 16b used as a resistive element is made of oxide semiconductor.

An insulating layer 18 is formed on a gate insulating layer 14 that includes the active layer 16a and the resistance layer 16b and contact holes 18a are formed to expose the source area and the drain area of the active layer 16a and contact holes 18b are formed on both side portions of the resistance layer 16b.

Source and drain electrodes 20a connected to the source and drain areas of the active layer 16a through the contact holes 18a and a wiring layer 20b connected to both side portions of the resistance layer 16b are formed on the insulating layer 18.

A passivation layer 22 for insulation and planarization is formed on the insulating layer 16 that includes the source and drain electrodes 20a and the wiring layer 20b and a via hole 22a is formed on the passivation layer 22 to expose the source or drain electrodes 20a. An anode electrode 24a, which is connected to the source or drain electrode 20a through the via hole 22a, is formed on the passivation layer 22 on the pixel area P and a capping layer 24b is formed on the passivation layer 22 of the non-activation area R.

A pixel definition layer 26 is formed on the passivation layer 22 of the pixel area P including the anode electrode 24a and the opening part is formed in the pixel definition layer 26 to expose the anode electrode 24a of the light emitting area. An organic light emitting layer 28 is formed on the anode electrode 24a of the exposed light emitting area and a cathode electrode 30 is formed on the pixel definition layer 26 including the organic light emitting layer 28.

The organic light emitting display device applies a predetermined voltage to the anode electrode 24a and the cathode electrode 30 by driving the thin film transistor by the signal provided to the organic light emitting display device from the outside through the wiring layer 20b and displays characters or images by emitting light emitted from the organic light emitting layer 28 to the outside due to the energy difference generated during the process of recombining holes injected through the anode electrode 24a with electrons injected through the cathode electrode 30 in the organic light emitting layer 28.

An aspect of the present invention will be described in detail through the process of manufacturing the organic light emitting display device.

FIGS. 2A to 2G are cross-sectional views explaining a method of manufacturing an organic light emitting display device according to an embodiment of the present invention.

Figure 2A:
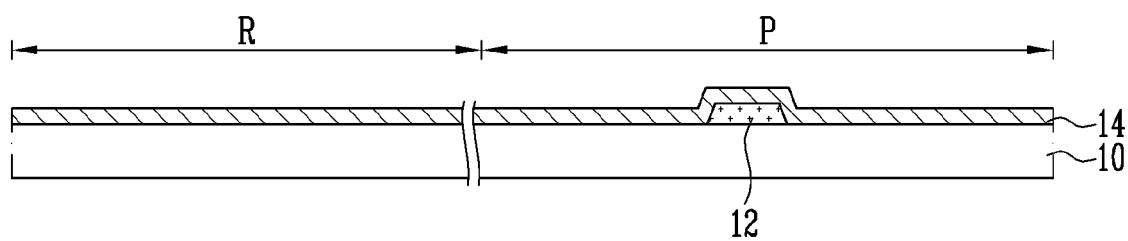
FIGS. 2A to 2G are cross-sectional views explaining a method of manufacturing an organic light emitting display device according to an embodiment of the present invention.

Referring to FIG. 2A, the substrate 10, which is made of insulating materials such as transparent glass or plastic, is prepared. The substrate 10 includes the pixel area P in which the thin film transistor and the organic light emitting device are formed and the non-pixel area R in which the driving circuit, the wiring, the pad part, the non-pixel area R for electrostatic discharge, etc., are formed.

First, the gate electrode 12 of the thin film transistor is formed on a substrate 10 in the pixel area P and the gate insulating layer 14 is formed on the substrate 10 in the pixel area P including the gate electrode 12 and the gate insulating layer 14 is formed on the non-pixel area R. The buffer layer (not shown) of a silicon oxide layer or a silicon nitride layer may be formed on the substrate 10 of the pixel area P and on the non-pixel area before forming the gate electrode 12.

Figure 2B:
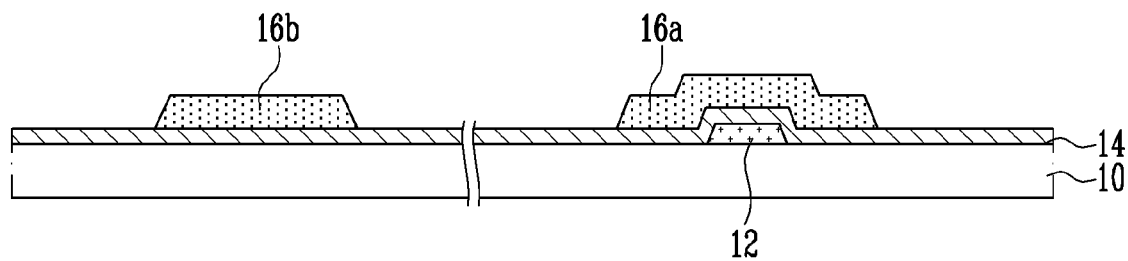

Referring to FIG. 2B, the oxide semiconductor layer is formed on the gate insulating layer 14 of the pixel area P and the non-pixel area R and then is patterned to form the active layer 16a on the gate insulating layer 14 of the pixel area P including the gate electrode 12 and to form the resistance layer 16b on the gate insulating layer 16 of the non-pixel area R. The oxide semiconductor layer is made of zinc oxide (ZnO) or is made of, for example, InZnO (IZO), GaInZnO (GIZO), HfInZnO (HIZO), etc., that are formed by doping indium (In), hafnium (Hf), tin (Sn), etc. in zinc oxide (ZnO).

Figure 2C:
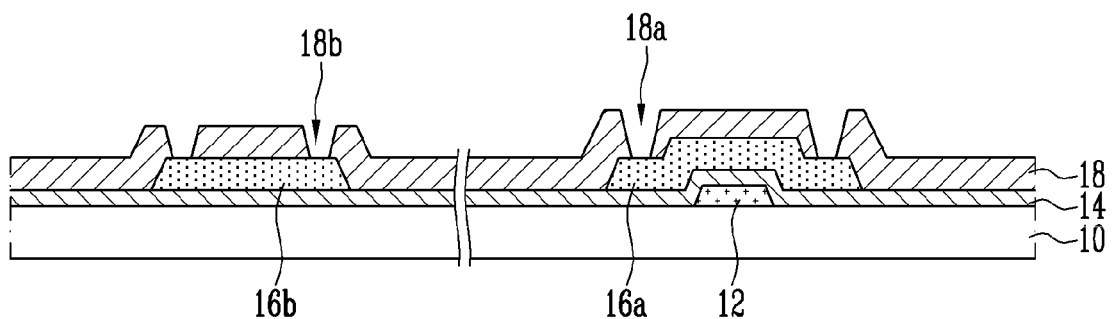

Referring to FIG. 2C, the insulating layer 18 is formed on the gate insulating layer 14 that includes the active layer 16a and the resistance layer 16b and then is patterned, thereby forming the contact holes 18a and 18b to expose the source and drain areas of the active layer 16a and both side portions of the resistance layer 16b.

Figure 2D:
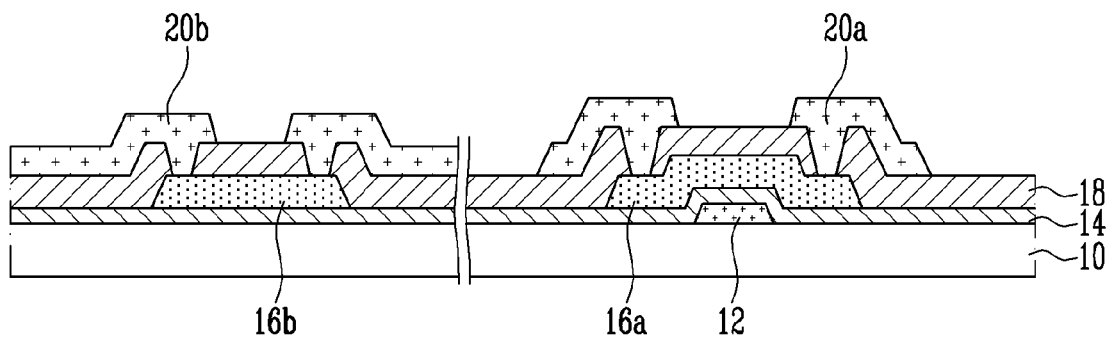

Referring to FIG. 2D, a conductive layer is formed on the insulating layer 18 to bury the contact holes 18a and 18b and then patterned, thereby forming the source and drain electrodes 20a that are connected to the source and drain areas of the active layer 16a through the contact holes 18a and the wiring layer 20b that is connected to both side portions of the resistance layer 16b through the contact holes 18b.

During the process of patterning the conductive layer in order to form the source and drain electrodes 20a, the insulating layer 18 is used as an etch stop layer. Although the patterning process includes the dry etching, the insulating layer 18 is formed on the active layer 16a of the channel area, such that the change in electrical characteristics can be prevented due to the damage of the active layer 16a.

Figure 3:
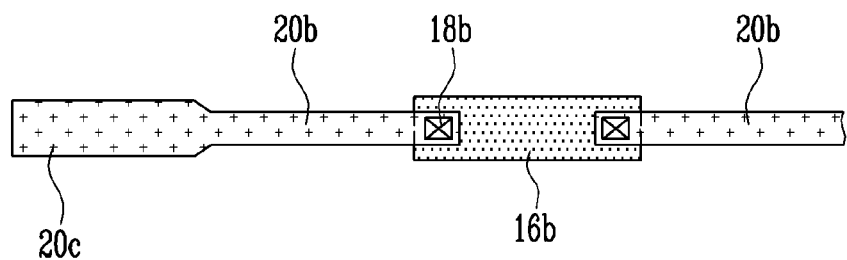
FIG. 3 is a layout diagram illustrating embodiments of the present invention.

FIG. 3 shows the resistance layer 16b as the resistance element for preventing the electrostatic discharge being connected to the wiring layer 20b between the pad part 20c and the driving circuit (not shown). However, as another embodiment, in order to interrupt the electrostatic discharge introduced from the edge part of the substrate, for example, the other side of the pad part, for example, the resistance element 16b may be connected between the pad part and a shorting bar for testing.

Figure 2E:
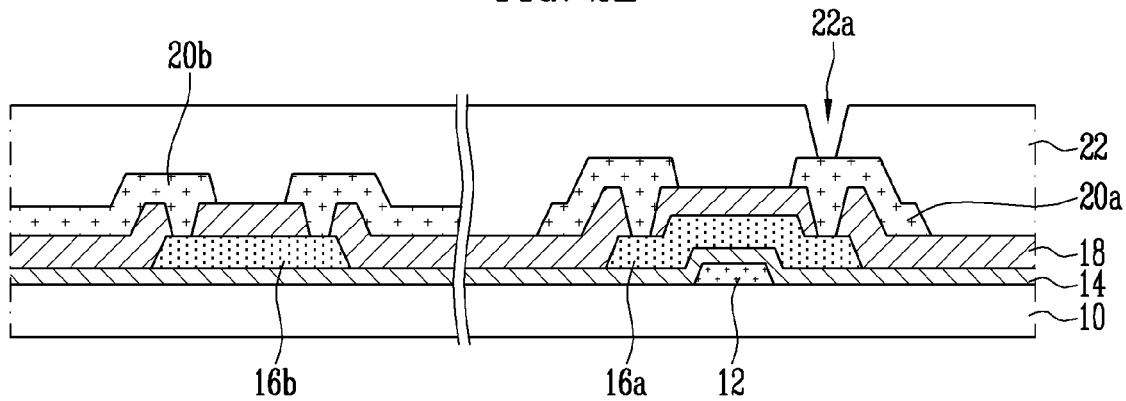

Referring to FIG. 2E, the passivation layer 22 of organic materials for insulation and planarization is formed on the insulating layer 16 that includes the source and drain electrodes 20a and the wiring layer 20b and then patterned, thereby forming the via hole 22a to expose the source or drain electrode 20a. As the organic materials, acrylic or polyimid is used.

Figure 2F:
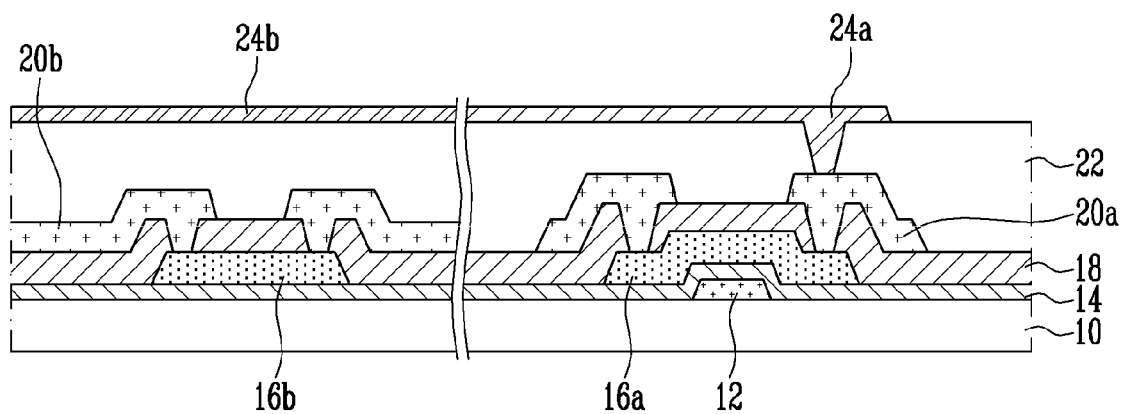

Referring to FIG. 2F, the conductive layer is formed on the passivation layer 22 of the pixel area P and on the non-pixel area R and then patterned, thereby forming the anode electrode 24a connected to the source or drain electrode 20a through the via hole 22a in the pixel area P and forming the capping layer 24b to be overlapped with the resistance layer 16b in the non-pixel area R. The conductive layer may be formed by thinly depositing transparent conductive materials such as indium tin oxide (ITO) and indium zinc oxide (IZO), metals such as tungsten (W), titanium (Ti), molybdenum (Mo), silver (Ag), tantalum (Ta), aluminum (Al), copper (Cu), gold (Au), chromium (Cr), and niobium (Nb), etc., or an alloy of the metals.

Thereafter, in order to remove the etching by-products and the pollutant materials, the washing process is performed by a hydrogen (H) containing washing solution. It is preferable that water $H_2O$ be used as the washing solution in order to effectively infiltrate hydrogen (H) into the passivation layer 22 of the organic material.

Figure 2G:
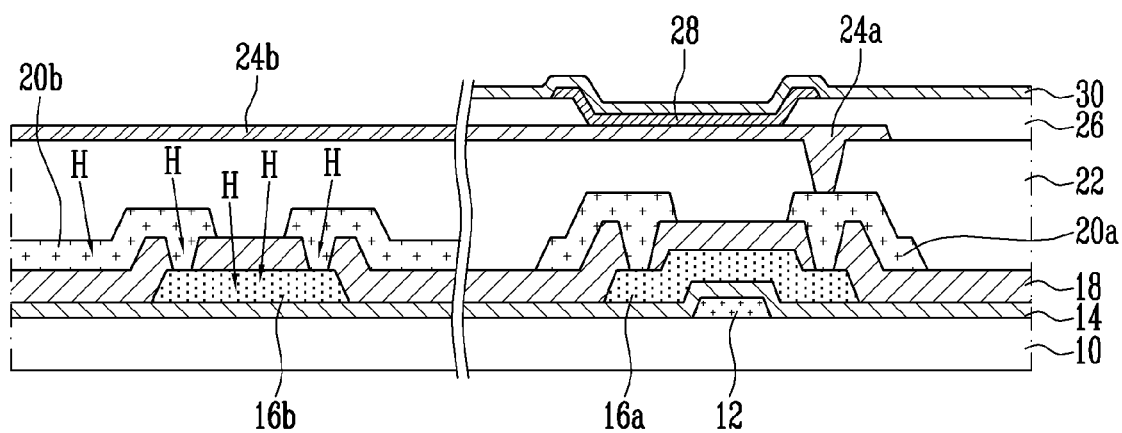

Referring to FIG. 2G, a pixel definition layer 26 is formed on the passivation layer 22 including the anode electrode 24a and then patterned, thereby exposing the anode electrode 24a of the light emitting area. The organic light emitting layer 28 is formed on the exposed anode electrode 24a and a cathode electrode 30 is formed on the pixel definition layer 26 including the organic light emitting layer 28.

Hydrogen H infiltrated into the passivation layer 22 of the organic materials during the manufacturing process of FIG. 2G is diffused to the outside but the infiltrated H is not diffused to the outside in the lower part of the capping layer 24b and therefore, the H is diffused to the lower resistance layer 16b, thereby increasing the concentration of hydrogen H of the oxide semiconductor. When the hydrogen concentration is increased, the carrier concentration is increased. As a result, the resistance value of the oxide semiconductor is reduced to a resistance value that is used as the resistive element. Therefore, in order to promote the diffusion of hydrogen H, it is preferable that heat treatment is included in the manufacturing process of FIG. 2G.

The oxide semiconductor has a high (Mega ohm/square) resistance value but when hydrogen H is infiltrated, the carrier concentration is increased, thereby making it possible to reduce the resistance value. When the capping layer 24 is not formed on the upper part of the resistance layer 16b, since hydrogen H infiltrated into the passivation layer 22 is more quickly diffused to the outside, the resistance value of the resistance layer 16b becomes about 3e+6 ohm/square. On the other hand, when the capping layer 24 is formed on the upper part of the resistance layer 16b, since hydrogen H infiltrated into the passivation layer 22 is not diffused to the outside and is diffused to the lower resistance layer 16b, the resistance value of the resistance layer 16b is reduced to about 2e+4 ohm/square.

When P+ ions are doped in a polysilicon, the polysillicon has a resistance value of about 1e+3 ohm/square, such that the resistance element according to an aspect of the present invention has a higher resistance value than when using the polysilicon alone, however, the polysilicon cannot be used for the display device.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device, comprising:
a substrate having a pixel area and a non-pixel area;
an insulating layer disposed on the substrate;
a resistance layer formed on the insulating layer and in the non-pixel area;
a wiring layer connected to opposing sides of the resistance layer;
an active layer formed in the pixel area and on the insulating layer;
a passivation layer formed on the active layer, the resistance layer, and the wiring layer; and
a capping layer formed on the passivation layer and covering the resistance layer, wherein:
the active layer and the resistance layer comprise an oxide semiconductor, and the concentration of hydrogen in the resistance layer is greater than the concentration of hydrogen in the active layer.

2. The organic light emitting display device as claimed in claim 1, wherein the oxide semiconductor comprises zinc oxide (ZnO).

3. The organic light emitting display device as claimed in claim 2, wherein the oxide semiconductor is doped with at least one ion of gallium (Ga), Indium (In), hafnium (Hf), tin (Sn), and combinations thereof.

4. The organic light emitting display device as claimed in claim 1, further comprising an insulating layer formed on an upper part of the resistance layer,
wherein the wiring layer is connected to the resistance layer through a contact hole formed in the insulating layer.

5. The organic light emitting display device as claimed in claim 1, wherein the passivation layer comprises acrylic or polyimide.

6. The organic light emitting display device as claimed in claim 1, wherein the capping layer is made of any one of ITO (Indium Tin Oxide), IZO (Indium Zinc Oxide), and metal.

7. An organic light emitting display device, comprising:
a substrate comprising a display area and a non-display area;
an insulating layer disposed on the substrate;
a resistance layer disposed on the insulating layer and in the non-display area, the resistance layer comprising an oxide semiconductor;
a first wiring layer connected to the resistance layer and comprising a pad part disposed at an edge of the substrate;
a second wiring layer to connect to the resistance layer to a driving circuit;
an active layer disposed in the display area and on the insulating layer, the active comprising the oxide semiconductor;
an organic layer disposed over the active layer; and
a capping layer disposed in the non-display area and covering the resistance layer,
wherein the concentration of hydrogen in the resistance layer is greater than the concentration of hydrogen in the active layer.

* * * * *